US010355107B2

(12) United States Patent
Min et al.

(10) Patent No.: US 10,355,107 B2
(45) Date of Patent: Jul. 16, 2019

(54) POLYCRYSTALLINE SILICON THIN FILM TRANSISTOR AND METHOD OF FABRICATING THE SAME, AND DISPLAY APPARATUS

(71) Applicant: BOE TECHNOLOGY GROUP CO., LTD., Beijing (CN)

(72) Inventors: Jian Min, Beijing (CN); Xiaolong Li, Beijing (CN); Tao Gao, Beijing (CN); Liangjian Li, Beijing (CN); Zhengyin Xu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 21 days.

(21) Appl. No.: 15/543,726

(22) PCT Filed: Jul. 25, 2016

(86) PCT No.: PCT/CN2016/091533
§ 371 (c)(1),
(2) Date: Jul. 14, 2017

(87) PCT Pub. No.: WO2018/018356
PCT Pub. Date: Feb. 1, 2018

(65) Prior Publication Data
US 2018/0331206 A1 Nov. 15, 2018

(51) Int. Cl.
H01L 21/02 (2006.01)
H01L 21/30 (2006.01)
(Continued)

(52) U.S. Cl.
CPC .... H01L 29/66757 (2013.01); H01L 21/0262 (2013.01); H01L 21/0272 (2013.01);
(Continued)

(58) Field of Classification Search
CPC ................................................. H01L 29/66757
(Continued)

(56) References Cited

U.S. PATENT DOCUMENTS

2004/0043547 A1 3/2004 Lee
2007/0295965 A1 12/2007 Chae et al.
(Continued)

FOREIGN PATENT DOCUMENTS

CN 103390592 A 11/2013
CN 103839826 A 6/2014
(Continued)

OTHER PUBLICATIONS

International Search Report & Written Opinion dated May 3, 2017, regarding PCT/CN2016/091533.

Primary Examiner — Bo Fan
(74) Attorney, Agent, or Firm — Intellectual Valley Law, P.C.

(57) ABSTRACT

The present application discloses a method of fabricating a polycrystalline silicon thin film transistor, the method including forming an amorphous silicon layer on a base substrate having a pattern corresponding to a polycrystalline silicon active layer of the thin film transistor; the amorphous silicon layer having a first region corresponding to a source electrode and drain electrode contact region in the polycrystalline silicon active layer and a second region corresponding to a channel region in the polycrystalline silicon active layer; forming a first dopant layer on a side of the second region distal to the base substrate; forming a second dopant layer on a side of the first region distal to the base substrate; and crystallizing the amorphous silicon layer, the first dopant layer, and the second dopant layer to form the polycrystalline silicon active layer, the polycrystalline silicon active layer being doped with a dopant of the first dopant layer in the second region and doped with a dopant of the second dopant layer in the first region during the step of crystallizing the amorphous silicon layer.

18 Claims, 13 Drawing Sheets

(51) Int. Cl.
  *H01L 27/12*    (2006.01)
  *H01L 29/36*    (2006.01)
  *H01L 29/66*    (2006.01)
  *H01L 21/027*   (2006.01)
  *H01L 29/786*   (2006.01)

(52) U.S. Cl.
  CPC .... *H01L 21/0274* (2013.01); *H01L 21/02532* (2013.01); *H01L 21/02592* (2013.01); *H01L 21/02675* (2013.01); *H01L 21/3003* (2013.01); *H01L 27/1285* (2013.01); *H01L 27/1288* (2013.01); *H01L 29/36* (2013.01); *H01L 29/78618* (2013.01); *H01L 29/78675* (2013.01)

(58) Field of Classification Search
  USPC .................. 438/166, 299; 257/43, 59, 72
  See application file for complete search history.

(56) References Cited

U.S. PATENT DOCUMENTS

| | | | |
|---|---|---|---|
| 2014/0077207 A1* | 3/2014 | Gao | G02F 1/1368 257/43 |
| 2014/0117461 A1* | 5/2014 | Chen | H01L 21/76895 257/401 |
| 2015/0294869 A1 | 10/2015 | Mao | |
| 2015/0340389 A1 | 11/2015 | Liu et al. | |
| 2016/0307978 A1* | 10/2016 | Liu | H01L 27/1274 |

FOREIGN PATENT DOCUMENTS

| | | | |
|---|---|---|---|
| CN | 105140128 A | 12/2015 | |
| CN | 105140130 A | 12/2015 | |

\* cited by examiner

POLYCRYSTALLINE SILICON THIN FILM TRANSISTOR AND METHOD OF FABRICATING THE SAME, AND DISPLAY APPARATUS

CROSS-REFERENCE TO RELATED APPLICATION

This application is a national stage application under 35 U.S.C. 371 of International Application No. PCT/CN2016/091533 filed Jul. 25, 2016, the contents of which are incorporated by reference in the entirety.

TECHNICAL FIELD

The present invention relates to a polycrystalline silicon thin film transistor, a method of fabricating the same, and a display apparatus having the same.

BACKGROUND

Polysilicon has a higher mobility rate and stability than amorphous silicon. Low temperature polycrystalline silicon (LTPS) thin film transistors have found a wide range of applications in display field. In conventional LTPS thin film transistors, the channel region is doped with a first dopant of a first type, and the source electrode and drain electrode contact region is doped with a second dopant of a second type. The first dopant and the second dopant are different types of dopants selected form a p-type dopant and an n-type dopant.

SUMMARY

In one aspect, the present invention provides a method of fabricating a polycrystalline silicon thin film transistor, the method comprising forming an amorphous silicon layer on a base substrate having a pattern corresponding to a polycrystalline silicon active layer of the thin film transistor; the amorphous silicon layer having a first region corresponding to a source electrode and drain electrode contact region in the polycrystalline silicon active layer and a second region corresponding to a channel region in the polycrystalline silicon active layer; forming a first dopant layer on a side of the second region distal to the base substrate; forming a second dopant layer on a side of the first region distal to the base substrate; and crystallizing the amorphous silicon layer, the first dopant layer, and the second dopant layer to form the polycrystalline silicon active layer, the polycrystalline silicon active layer being doped with a dopant of the first dopant layer in the second region and doped with a dopant of the second dopant layer in the first region during the step of crystallizing the amorphous silicon layer.

Optionally, the crystallizing step is performed using excimer laser annealing.

Optionally, the excimer laser annealing is performed with an overlapping ratio of about 90% to about 98%.

Optionally, the first dopant layer is formed to be in direct contact with the second region.

Optionally, the second dopant layer is formed to be in direct contact with the first region.

Optionally, the first dopant layer is formed on a side of both the first region and the second region distal to the base substrate; and the polycrystalline silicon active layer in the first region is doped with both the dopant of the first dopant layer and the dopant of the second dopant layer.

Optionally, the amorphous silicon layer and the first dopant layer are formed using a single mask plate.

Optionally, the step of forming the amorphous silicon layer and the first dopant layer using a single mask plate comprises depositing an amorphous silicon material layer on the base substrate; forming a first dopant material layer on a side of the amorphous silicon material layer distal to the base substrate; forming a photoresist layer on a side of the first dopant material layer distal to the amorphous silicon material layer; exposing the photoresist layer with a half-tone mask plate or a gray-tone mask plate, and developing the exposed photoresist layer to obtain a photoresist pattern having a first section corresponding to the first region, a second section corresponding to the second region, and a third section outside of the first section and the second section, the first section being partially exposed, the second section being substantially unexposed, the third section being fully exposed, and the photoresist material being removed in the third section; removing the amorphous silicon material layer and the first dopant layer in the third section, thereby forming the amorphous silicon layer having the pattern corresponding to the active layer of the thin film transistor; and removing the photoresist layer in the first section while maintaining the photoresist layer in the second section, thereby exposing the amorphous silicon layer in the first section.

Optionally, the method further comprises forming a second dopant material layer, on a side of the amorphous silicon layer in the first section distal to the base substrate and on a side of the photoresist layer in the second section distal to the amorphous silicon layer; and removing the photoresist layer in the second section thereby exposing the first dopant layer in the second section.

Optionally, the photoresist layer in the second section is removed by a lift-off method using a lift-off solvent.

Optionally, the method further comprises dehydrogenating the amorphous silicon layer prior to the step of crystallizing the amorphous silicon layer, the first dopant layer, and the second dopant layer.

Optionally, the method further comprises forming a buffer layer on the base substrate prior to the step of forming the amorphous silicon layer, the amorphous silicon layer being formed on a side of the buffer layer distal to the base substrate.

Optionally, the buffer layer has a thickness in the range of about 1000 Å to about 4000 Å.

Optionally, the method further comprises forming an ancillary amorphous silicon layer on the base substrate prior to the step of forming the buffer layer, the buffer layer being formed on a side of the ancillary amorphous silicon layer distal to the base substrate.

Optionally, the method further comprises dehydrogenating the ancillary amorphous silicon layer prior to the step of crystallizing the amorphous silicon layer, the first dopant layer, and the second dopant layer.

Optionally, the ancillary amorphous silicon layer has a thickness in the range of about 10 nm to about 60 nm.

Optionally, the method further comprises forming a gate insulating layer on a side of the polycrystalline silicon active layer distal to the base substrate; forming a gate electrode layer on a side of the gate insulating layer distal to the polycrystalline silicon active layer; forming a source via and a drain via in areas corresponding to the first region, the source via and the drain via extending through the gate insulating layer, exposing the first region of the polycrystalline silicon active layer; and forming a source electrode and a drain electrode on a side of the gate insulating layer distal to the base substrate, the source electrode extending through the source via and in contact with the polycrystalline silicon active layer, the drain electrode extending through the drain via and in contact with the polycrystalline silicon active layer.

Optionally, the first dopant layer and the second dopant layer are deposited on the base substrate by atomic layer deposition.

Optionally, the amorphous silicon layer has a thickness in the range of about 30 nm to about 60 nm.

Optionally, the first dopant layer comprises a first dopant having a first conductivity type and the second dopant layer comprises a second dopant having a second conductivity type; the first dopant and the second dopant are of different types of dopants selected from a p-type dopant and an n-type dopant.

Optionally, the first dopant layer comprises a first dopant and the second dopant layer comprises a second dopant; the first dopant and the second dopant are of a same type selected from a p-type dopant and an n-type dopant.

Optionally, the first dopant layer has a concentration of the first dopant in a range of about $1\times10^{11}$ atom/cm$^3$ to $1\times10^{13}$ atom/cm$^3$.

Optionally, the second dopant layer has a concentration of the second dopant in a range of about $1\times10^{14}$ atom/cm$^3$ to $1\times10^{16}$ atom/cm$^3$.

In another aspect, the present invention provides a polycrystalline silicon thin film transistor fabricating by a method described herein.

In another aspect, the present invention provides a display apparatus comprising a thin film transistor described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
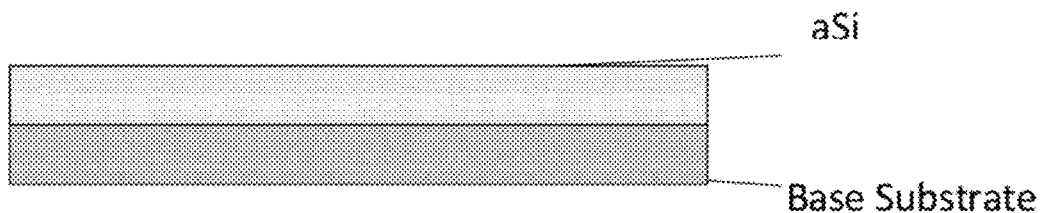
FIGS. 1A-1O illustrate a fabricating process of a thin film transistor in some embodiments in cross-section view of the thin film transistor.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In manufacturing a conventional LTPS thin film transistor, an ion implantation process is utilized to dope the polycrystalline silicon active layer with dopants. A conventional LTPS thin film transistor fabricated by the ion implantation process in a low operating temperature range has a relatively large leak current. In order to achieve a satisfactory dopant diffusion, typically the ion implantation is performed in a high operating temperature range, e.g., higher than 600 degree Celsius. The high temperature ion implantation process, however, results in thermal damages in the base substrate. This problem is particularly prominent for flexible base substrates such as a polyimide base substrate.

Accordingly, the present disclosure provides a novel LTPS thin film transistor and a method of fabricating the same that substantially obviates one or more of the problems due to limitations and disadvantages of the related art. In one aspect, the present disclosure provides a method of fabricating a polycrystalline silicon thin film transistor. In some embodiments, the method includes forming an amorphous silicon layer on a base substrate having a pattern corresponding to a polycrystalline silicon active layer of the thin film transistor, the amorphous silicon layer having a first region corresponding to a source electrode and drain electrode contact region in the polycrystalline silicon active layer and a second region corresponding to a channel region in the polycrystalline silicon active layer; forming a first dopant layer on a side of the second region distal to the base substrate; forming a second dopant layer on a side of the first region distal to the base substrate; crystallizing the amorphous silicon layer, the first dopant layer, and the second dopant layer to form the polycrystalline silicon active layer, the polycrystalline silicon active layer being doped with a dopant of the first dopant layer (e.g., a first dopant) in the second region and doped with a dopant of the second dopant layer (e.g., a second dopant) in the first region during the step of crystallizing the amorphous silicon layer. Optionally, the first dopant layer is formed to be in direct contact with the second region. Optionally, the second dopant layer is formed to be in direct contact with the first region. Optionally, the first dopant layer is formed on a side of both the first region and the second region distal to the base substrate, and the polycrystalline silicon active layer in the first region is doped with both the dopant of the first dopant layer and the dopant of the second dopant layer. Optionally, when the first dopant layer is formed on a side of both the first region and the second region distal to the base substrate, the second dopant layer is formed to be in direct contact with the first dopant layer in an area corresponding to the first region. Optionally, the first dopant and the second dopant are of different types of dopants selected from a p-type dopant and an n-type dopant. Optionally, the first dopant and the second dopant are dopants of a same type. Optionally, the first dopant and the second dopant are the same dopant, and a concentration of the first dopant of the first dopant layer is different from that of the second dopant of the second dopant layer (e.g., a light doping region and a heavy doping region). As defined herein, the term "channel region" refers to a region of a thin film transistor between a source electrode contact region and a drain electrode contact region.

Figure 1B:
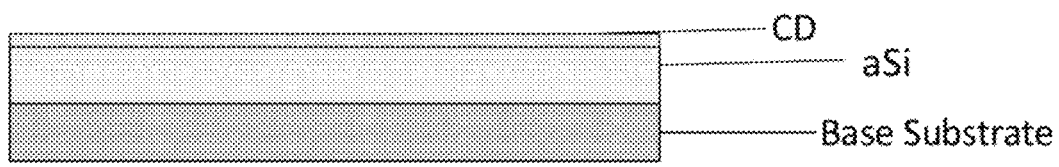
Figure 1C:
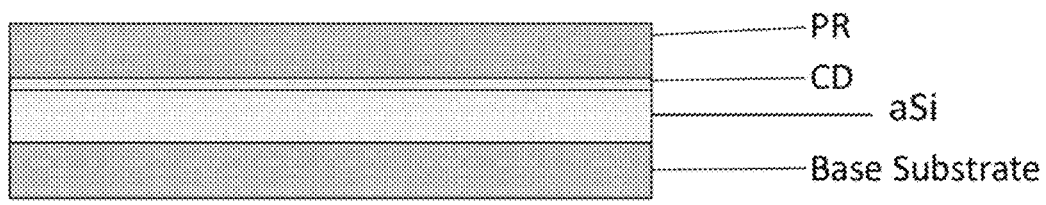
Figure 1D:
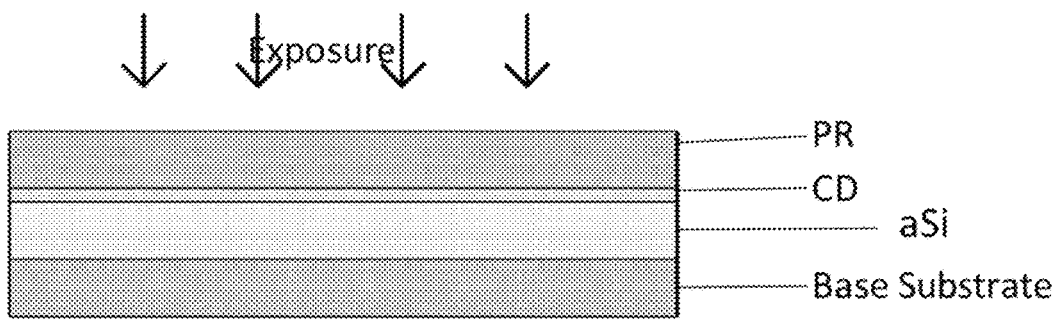
Figure 1E:
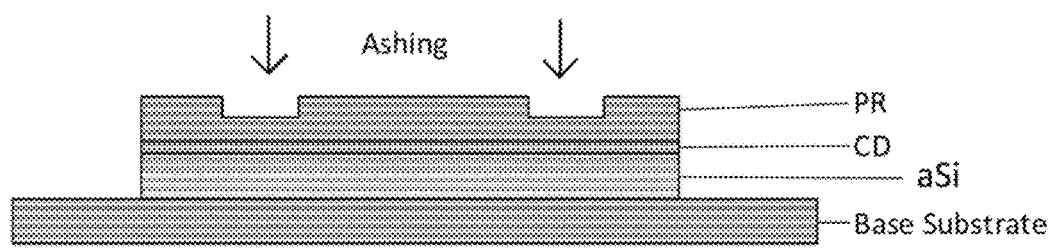
Figure 1F:
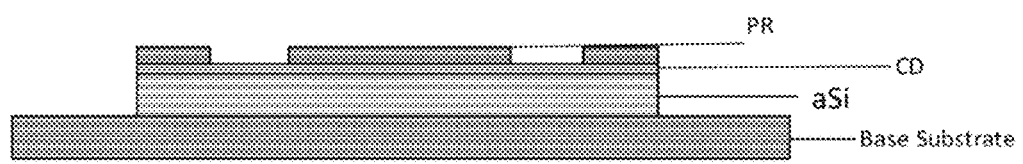
Figure 1G:
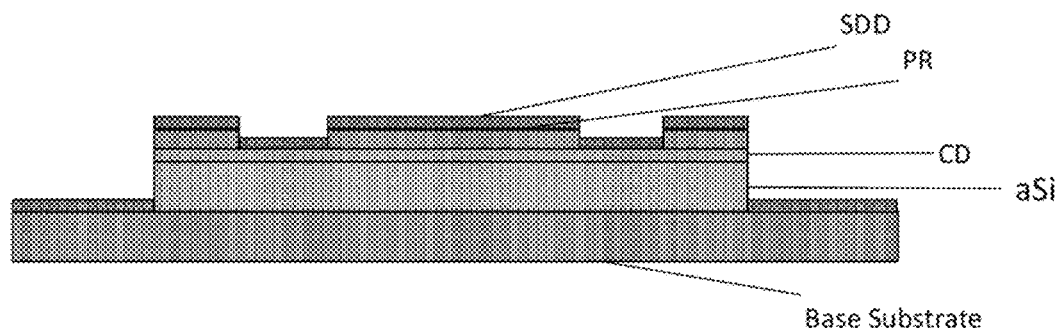
Figure 1H:
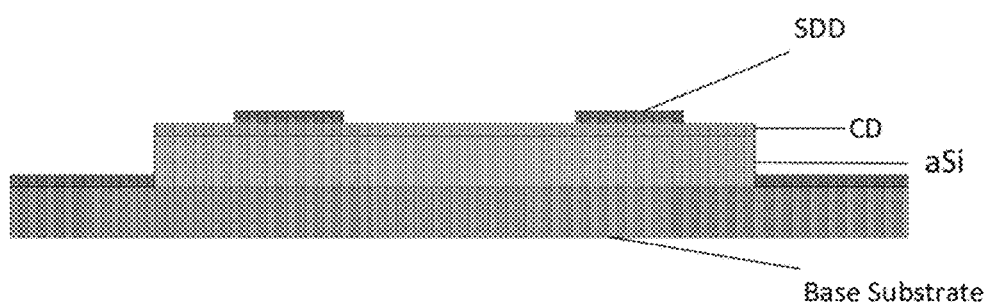
Figure 1I:
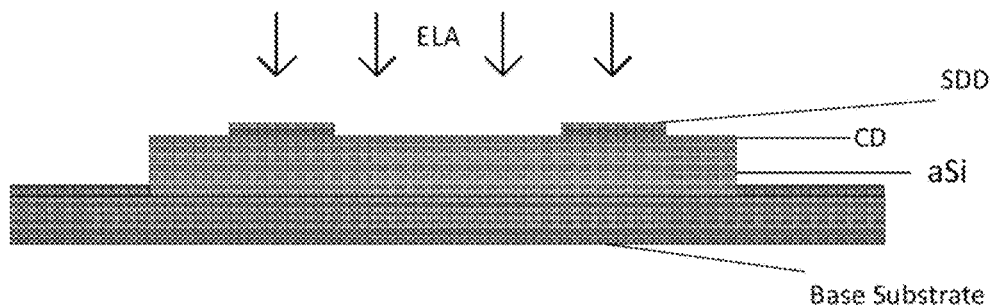
Figure 1J:
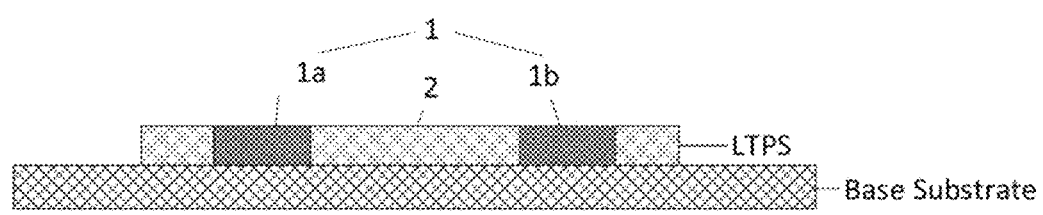
Figure 1K:
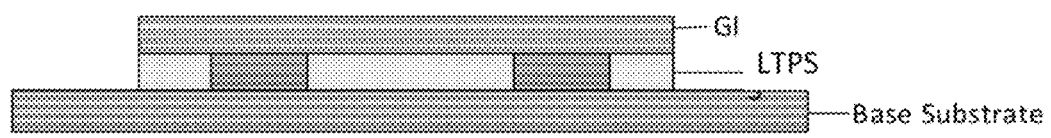
Figure 1L:
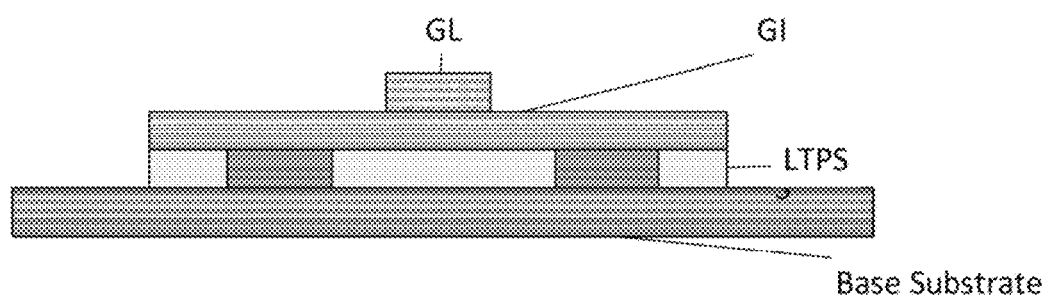
Figure 1M:
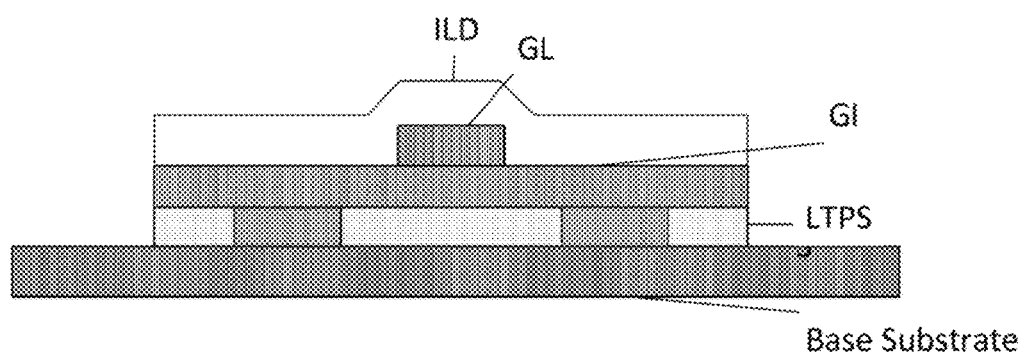
Figure 1N:
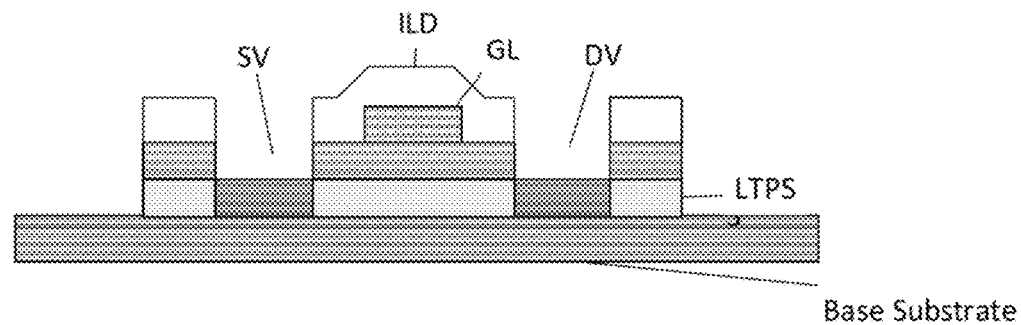
Figure 1O:
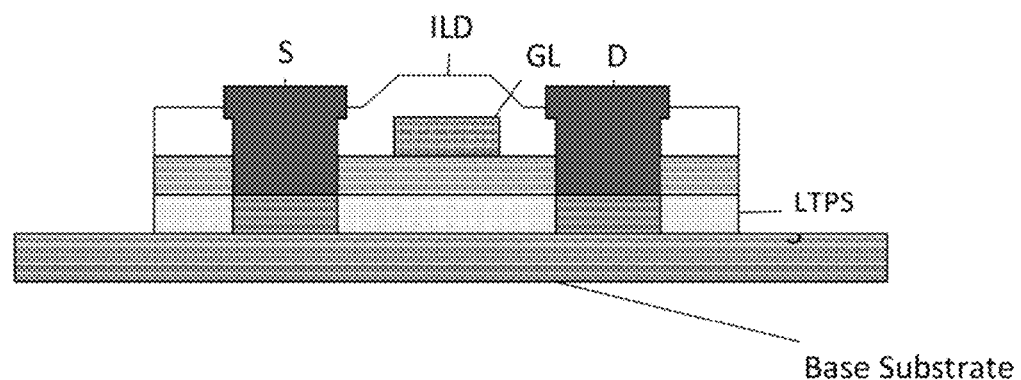
Figure 2A:
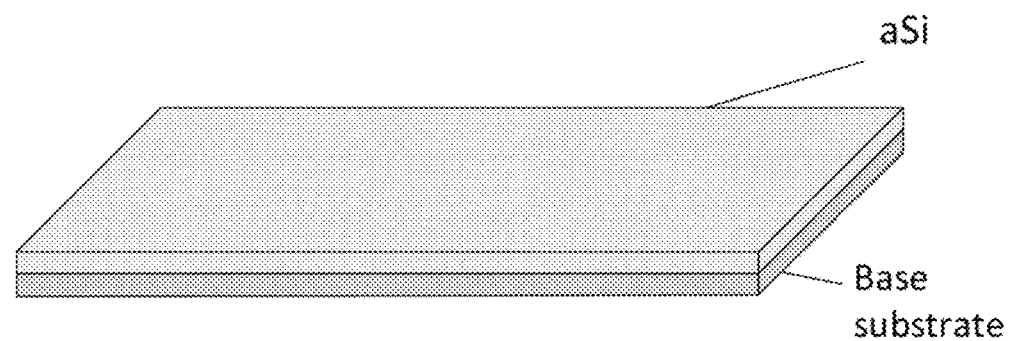
FIGS. 2A-2O illustrate a fabricating process of a thin film transistor in some embodiments in perspective view of the thin film transistor.

FIG. 1A-1O illustrates a fabricating process of a thin film transistor in some embodiments in cross-section view of the thin film transistor. FIG. 2A-2O illustrates a fabricating process of a thin film transistor in some embodiments in perspective view of the thin film transistor. Referring to FIG. 1A and FIG. 2A, the method in the embodiment includes forming an amorphous silicon layer aSi on a Base substrate. In some embodiments, the thickness of the amorphous silicon layer is in the range of about 30 nm to about 60 nm, e.g., about 30 nm to about 35 nm, about 35 nm to about 40 nm, about 40 nm to about 45 nm, about 45 nm to about 50 nm, about 50 nm to about 55 nm, or about 55 nm to about 60 nm.

Various appropriate materials may be used for making the base substrate. Examples of materials suitable for making the base substrate include, but are not limited to, glass, quartz, polyimide, and polyester, etc. Optionally, the base substrate is a flexible base substrate (e.g., polyimide base substrate). Optionally, the base substrate is a relatively inflexible base substrate (e.g., a glass base substrate).

In some embodiments, prior to forming the amorphous silicon layer aSi, the method further includes a pre-cleaning step to remove contaminants from the surface of the base substrate prior to any subsequent step.

In some embodiments, prior to forming the amorphous silicon layer aSi, the method further includes forming a buffer layer (not shown in the figures) on the Base substrate. Optionally, the buffer layer is between the Base substrate and the amorphous silicon layer aSi, e.g., on a side of the amorphous silicon layer aSi proximal to the Base substrate. Various appropriate materials may be used for making the buffer layer. Examples of materials suitable for making the buffer layer include, but are not limited to, silicon oxide ($SiO_x$), silicon nitride ($SiN_x$), or a combination thereof. Optionally, the thickness of the buffer layer is in the range of about 1000 Å to about 4000 Å, e.g., about 1000 Å to about 3000 Å, about 2000 Å to about 4000 Å, or about 2000 Å to about 3000 Å.

In some embodiments, prior to forming the buffer layer, the method further includes forming an ancillary amorphous silicon layer (not shown in the figures) on the Base substrate. Optionally, the ancillary amorphous silicon layer is between the buffer layer and the Base substrate, e.g., on a side of the buffer layer proximal to the Base substrate. In some embodiments, the thickness of the ancillary amorphous silicon layer is in the range of about 10 nm to about 60 nm, e.g., about 10 nm to about 20 nm, about 20 nm to about 30 nm, about 30 nm to about 40 nm, about 40 nm to about 50 nm, or about 50 nm to about 60 nm. The ancillary amorphous silicon layer absorbs heat released during a crystallization step (e.g., an excimer laser annealing step) of the amorphous silicon layer aSi, and prevent damages to the Base substrate during the crystallization step.

In some embodiments, the method further includes dehydrogenating the ancillary amorphous silicon layer. Optionally, the step of dehydrogenating the ancillary amorphous silicon layer is performed prior to the formation of the buffer layer on the ancillary amorphous silicon layer. Optionally, the step of dehydrogenating the ancillary amorphous silicon layer is performed subsequent to the formation of the buffer layer on the ancillary amorphous silicon layer but prior to the formation of amorphous silicon layer. The purpose of the dehydrogenation process is to reduce or eliminate hydrogen contents in the ancillary amorphous silicon layer. This prevents the occurrence of hydrogen explosion during the crystallization step. Optionally, the method includes, sequentially, forming an ancillary amorphous silicon layer on the Base substrate, forming a buffer layer on a side of the ancillary amorphous silicon layer distal to the Base substrate, dehydrogenating the ancillary amorphous silicon layer and the buffer layer, and forming an amorphous silicon layer on a side of the buffer layer distal to the ancillary amorphous silicon layer.

In some embodiments, the method further includes dehydrogenating the amorphous silicon layer aSi. Similarly, the purpose of the dehydrogenation process is to reduce or eliminate hydrogen contents in the amorphous silicon layer, and prevent the occurrence of hydrogen explosion during the crystallization step.

In some embodiments, the dehydrogenation step is performing using a thermal annealing method. The temperature for the thermal annealing process can be determined based on several factors, including the material used for making the Base substrate. For example, the thermal annealing temperature can be relatively higher when using a glass base substrate as compared to the thermal annealing temperature suitable for a flexible base substrate. Optionally, the thermal annealing is performed in a chamber having nitrogen gas as the ambient atmosphere. Optionally, the thermal annealing temperature is below 400 degree Celsius, e.g., in the range of about 300 degree Celsius to about 400 degree Celsius.

In some embodiments, the Base substrate is a relatively inflexible base substrate such as a glass substrate. Optionally, the method includes forming an amorphous silicon layer aSi on the Base substrate and dehydrogenating the amorphous silicon layer aSi. Optionally, the method includes forming a buffer layer on the Base substrate, forming an amorphous silicon layer aSi on a side of the buffer layer distal to the Base substrate, and dehydrogenating the amorphous silicon layer aSi.

In some embodiments, the Base substrate is a flexible base substrate such as a polyimide base substrate. Optionally, the method includes forming a flexible base substrate (e.g., a polyimide base substrate) on a glass substrate, forming an ancillary amorphous silicon layer on the flexible base substrate, forming a buffer layer (e.g., a buffer layer comprising a combination of silicon oxide and silicon nitride such as a stacked silicon oxide and silicon nitride bilayer) on a side of the ancillary amorphous silicon layer distal to the flexible base substrate, dehydrogenating the ancillary amorphous silicon layer, forming an amorphous silicon layer on a side of the buffer layer distal to the ancillary amorphous silicon layer. Optionally, the step of dehydrogenating the ancillary amorphous silicon layer is performed prior to the step of forming the buffer layer. Optionally, the step of dehydrogenating the ancillary amorphous silicon layer is performed subsequent to the step of forming the buffer layer.

Figure 2B:
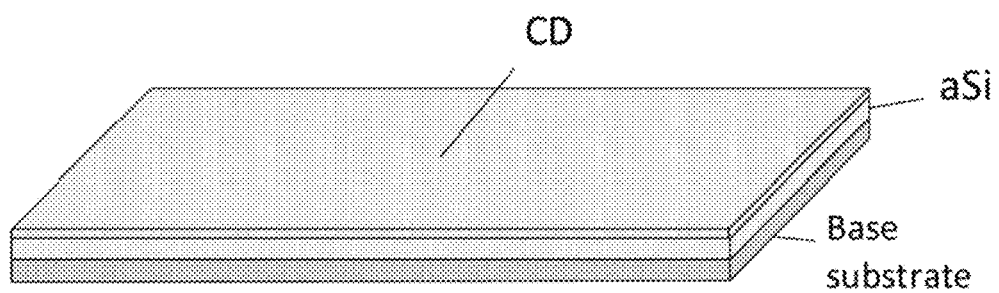

Referring to FIG. 1B and FIG. 2B, the method in some embodiments further includes forming a first dopant layer CD (e.g., a channel doping ("CD") layer) having a first conductivity type comprising a first dopant on a side of the amorphous silicon layer aSi distal to the Base substrate. In some embodiments, the first dopant is a P-type dopant such as a Group IIIA element of the Periodic Table of the Elements including boron (B), aluminum (Al), gallium (Ga), indium (In), and thallium (Tl). In some embodiments, the first dopant is an N-type dopant such as a Group VA element of the Periodic Table of the Elements including nitrogen (N), phosphorous (P), arsenic (As), antimony (Sb), and bismuth (Bi).

In some embodiments, the thin film transistor is an N-type thin film transistor and the first dopant is a P-type dopant. In some embodiments, the thin film transistor is an N-type thin film transistor and the first dopant is an N-type dopant. In some embodiments, the thin film transistor is an N-type thin film transistor, and the first dopant includes boron. In some embodiments, the thin film transistor is an N-type thin film transistor, and the first dopant includes one or both of phosphor and arsenic. In some embodiments, the thin film transistor is a P-type thin film transistor, and the first dopant includes one or both of phosphor and arsenic.

Various appropriate methods may be used to make the first dopant layer CD. Examples of appropriate methods include, but are not limited to, plasma enhanced chemical vapor deposition (PEVCD) and atomic layer deposition (ALD). Optionally, the first dopant layer CD is formed using the atomic layer deposition method. Various appropriate doping concentrations may be used for forming the first dopant layer. Optionally, the doping concentration is in the range of about $1 \times 10^{11}$ atom/cm$^3$ to $1 \times 10^{13}$ atom/cm$^3$, e.g., about $1 \times 10^{11}$ atom/cm$^3$ to $1 \times 10^{12}$ atom/cm$^3$ or about $1 \times 12$ atom/cm$^3$ to 1×10$^{13}$ atom/cm$^3$. Optionally, the first dopant layer CD is substantially a single atomic layer.

Figure 2C:
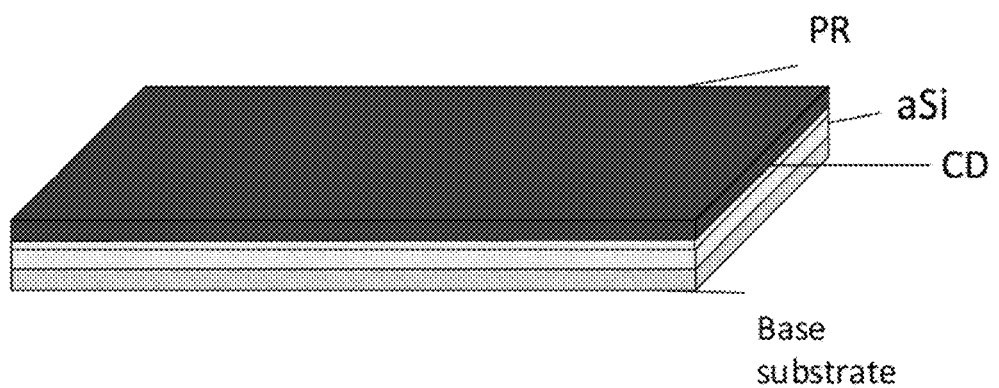

Referring to FIG. 1C and FIG. 2C, the method in some embodiments further includes forming a photoresist layer PR on a side of the first dopant layer CD distal to the amorphous silicon layer aSi. Optionally, the photoresist layer PR has a thickness in the range of about 1 µm to about 2.5 µm.

Figure 2D:
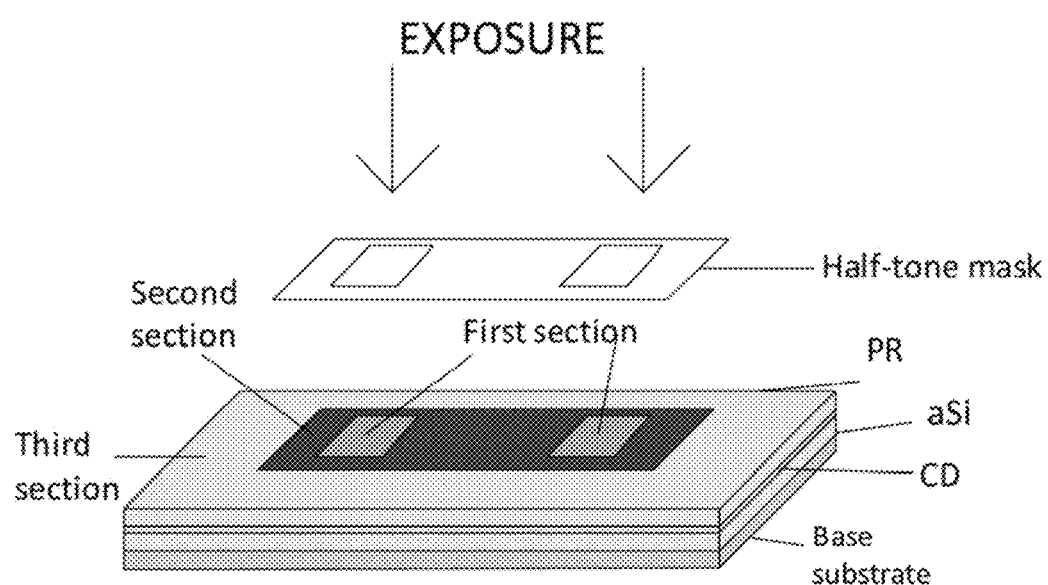
Figure 2E:
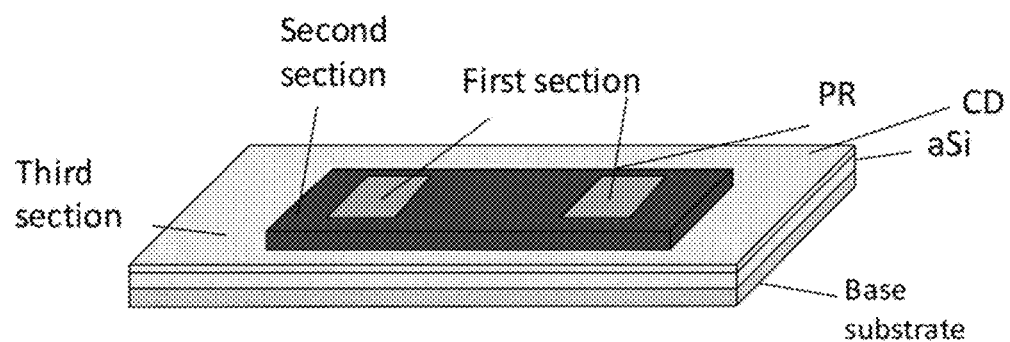

Referring to FIG. 1D and FIG. 2D, the method in some embodiments further includes exposing the photoresist layer PR with a half-tone mask plate or a gray-tone mask plate, and developing the exposed photoresist layer to obtain a photoresist pattern having a first section corresponding to a source electrode and a drain electrode of the thin film transistor, a second section corresponding to an active layer of the thin film transistor, and a third section outside of the first section and the second section, the photoresist material is removed in the third section (see, e.g., FIG. 2E). The first section is partially exposed, the second section is substantially unexposed, and the third section is fully exposed.

Figure 2F:
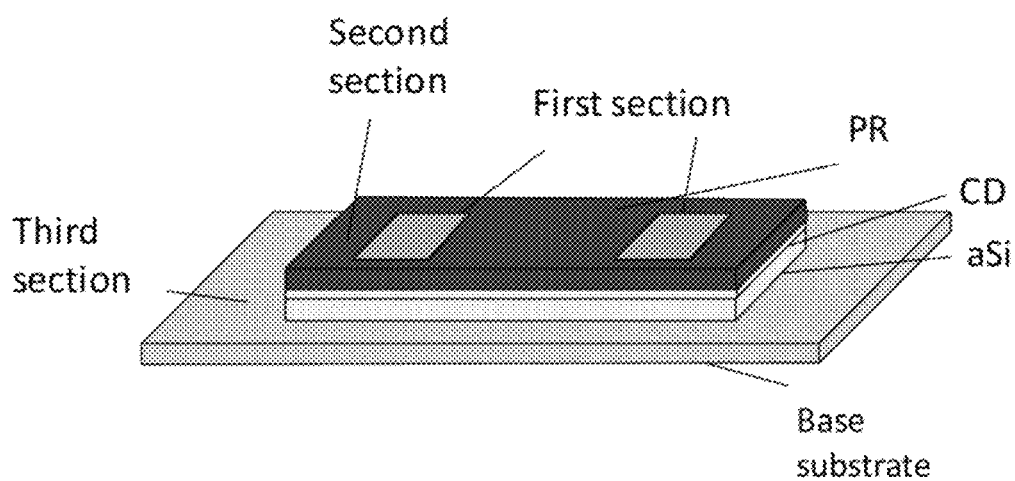

Subsequent to the removal of photoresist material in the third section, the method may further include removing the amorphous silicon layer aSi and the first dopant layer CD in the third section, thereby forming an amorphous silicon layer pattern corresponding to the active layer of the thin film transistor (see, e.g., FIG. 2F).

Figure 2G:
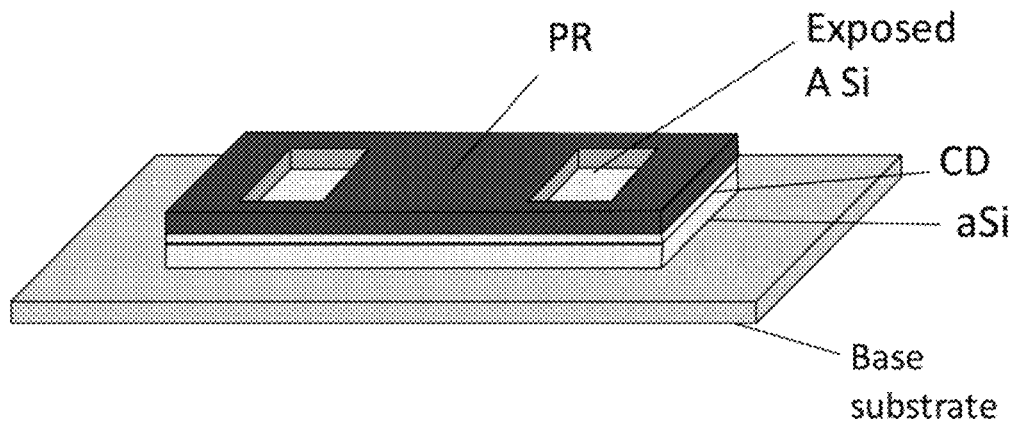

Referring to FIG. 1E, the method in some embodiments further includes removing (e.g., by ashing) the photoresist layer PR in the first section while maintaining the photoresist layer PR in the second section, thereby exposing the amorphous silicon layer aSi (and the residual first dopant layer CD) in the first section, as shown in FIG. 1F and FIG. 2G.

Figure 2H:
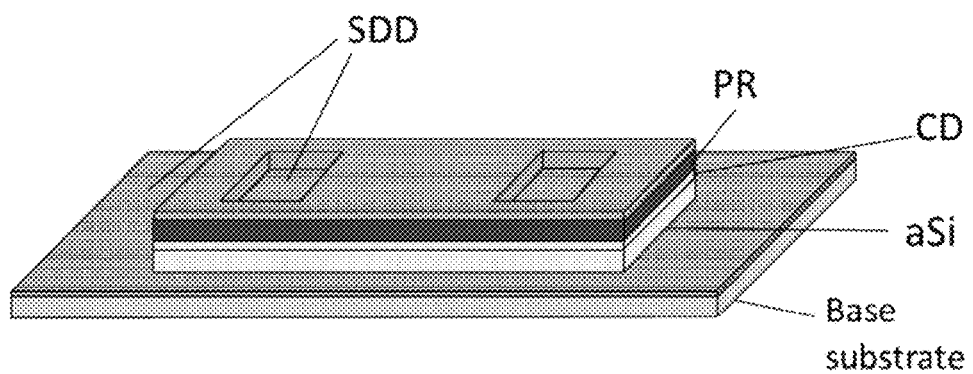

Referring to FIG. 1G and FIG. 2H, the method in some embodiments further includes forming a second dopant layer SDD (e.g., a source-drain doping ("SDD") layer) having a second conductivity type comprising a second dopant, on a side of the amorphous silicon layer aSi (and the residual first dopant layer) the first section distal to the Base substrate and on a side of the remaining photoresist layer in the second section distal to the amorphous silicon layer aSi. In some embodiments, the thin film transistor is an N-type thin film transistor, and the second dopant is an N-type dopant such as a Group VA element of the Periodic Table of the Elements including nitrogen (N), phosphorous (P), arsenic (As), antimony (Sb), and bismuth (Bi). In some embodiments, the thin film transistor is a P-type thin film transistor, and the first dopant is a P-type dopant such as a Group IIIA element of the Periodic Table of the Elements including boron (B), aluminum (Al), gallium (Ga), indium (In), and thallium (Tl).

In some embodiments, the thin film transistor is an N-type thin film transistor, and the second dopant includes one or both of phosphor and arsenic. Optionally, the second dopant layer includes phosphorous oxide, phosphorous nitride, or phosphorous oxynitride. Optionally, the second dopant layer includes arsenic oxide, arsenic nitride, or arsenic oxynitride. In some embodiments, the thin film transistor is a P-type thin film transistor, and the second dopant includes boron. Optionally, the second dopant layer includes boron oxide, boron nitride, or boron oxynitride.

Various appropriate methods may be used to make the second dopant layer SDD. Examples of appropriate methods include, but are not limited to, plasma enhanced chemical vapor deposition (PEVCD) and atomic layer deposition (ALD). Optionally, the second dopant layer SDD is formed using the atomic layer deposition method. Various appropriate doping concentrations may be used for forming the second dopant layer. Optionally, the doping concentration is in the range of about 1×10$^{14}$ atom/cm$^3$ to 1×10$^{16}$ atom/cm$^3$, e.g., about 1×10$^{14}$ atom/cm$^3$ to 1×10$^{15}$ atom/cm$^3$ or about 1×10$^{15}$ atom/cm$^3$ to 1×10$^{16}$ atom/cm$^3$. Optionally, the second dopant layer SDD is substantially a single atomic layer.

Figure 2I:
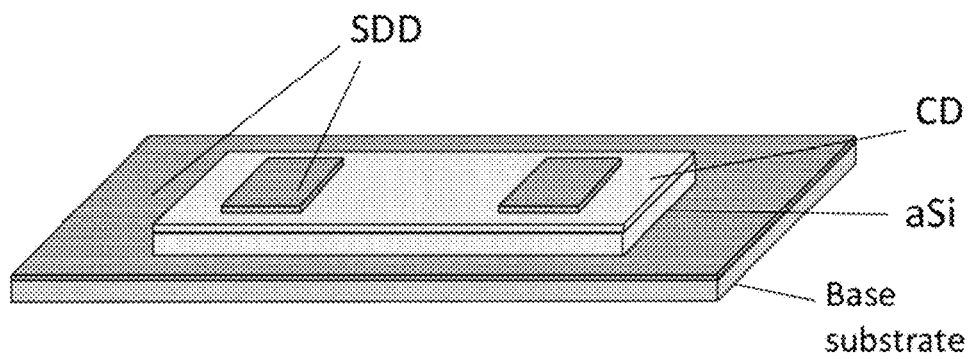

Referring to FIG. 1H an FIG. 2I, the method in some embodiments further includes removing the photoresist layer PR in the second section thereby exposing the first dopant layer CD in the second section. The second dopant layer SDD in the second section is also removed together with the removal of the photoresist layer PR in the second section. Various appropriate methods may be used to remove the photoresist layer PR in the second section. In some embodiments, the step of removing the photoresist layer PR in the second section is performed by stripping the photoresist layer PR in the second section. Optionally, the photoresist layer PR is stripping by ashing. Optionally, the photoresist layer PR is stripping by a lift-off method. For example, the photoresist layer PR may be subject to lift-off in a solvent, e.g., an organic solvent such as N-methylpyrrolidone (NMP). Optionally, the lift-off may be performed at a temperature, e.g., around 60 degree Celsius. Subsequent to the lift-off, the substrate is washed, e.g., using ethanol and dried. As shown in FIG. 1H an FIG. 2I, after the removal of the photoresist layer PR in the second section, the substrate includes a first dopant layer CD in the second section on a side of the amorphous silicon layer aSi distal to the Base substrate, and a second dopant layer SDD in the first section on a side of the amorphous silicon layer aSi (and the residual first dopant layer CD) distal to the Base substrate.

Figure 2J:
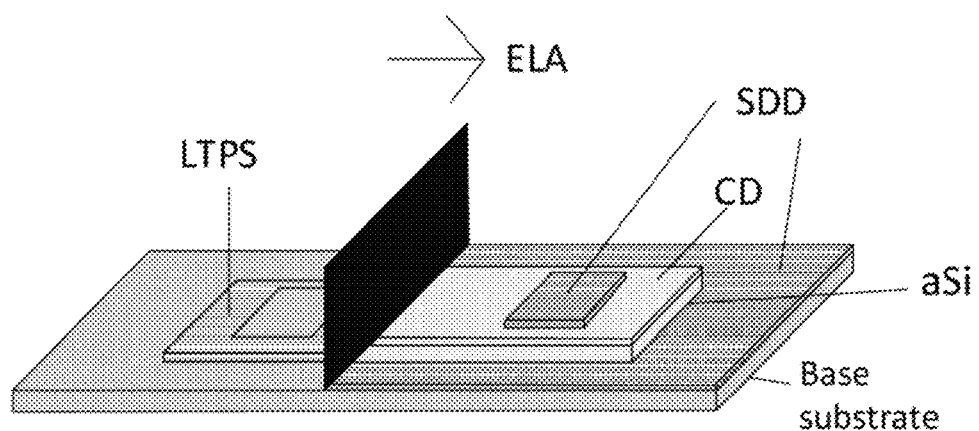

Referring to FIG. 1I and FIG. 2J, the method in some embodiments further includes crystallizing the amorphous silicon layer aSi (e.g., to form a polycrystalline silicon active layer). The crystallization step may be performed utilizing any appropriate crystallization method. In some embodiments, the crystallization step is performed utilizing a method selected from the group consisting of excimer laser annealing (ELA), solid phase crystallization (SPC), sequential lateral solidification (SLS), metal induced crystallization (MIC), and metal-induced lateral crystallization (MILC). Optionally, the crystallization step is performed using excimer laser annealing (as shown in FIG. 1I and FIG. 2J).

In some embodiments, the crystallizing step is performed at a low temperature, e.g., in a temperature range within which a flexible base substrate (e.g., a polyimide substrate) may be maintained substantially stable. Optionally, the crystallizing step is performed in a temperature range so that the temperature in the base substrate is kept below 400 degree Celsius, e.g., between about 300 degree Celsius and about 400 degree Celsius or between about 200 degree Celsius and about 300 degree Celsius or even lower.

In some embodiments, the crystallizing step is performed using excimer laser annealing. The excimer laser annealing is a method of fabricating a polycrystalline semiconductor layer at a low temperature. The excimer laser crystallizes an amorphous silicon layer by radiating a high energy laser beam onto the amorphous silicon layer for a time of tens of nanoseconds. The energy is substantially absorbed by the amorphous silicon layer, and consumed for phase transition of the amorphous silicon material. The amorphous silicon is melted and crystallized in a very short time period (e.g., during a laser pulse of about 15 ns to about 50 ns). The thermal effect of the excimer laser annealing is extremely localized, and may be limited within a depth of, e.g., about 20 nm, locally heating the amorphous silicon layer (e.g., heating limited within the amorphous silicon layer) to a temperature up to about 1000 degree Celsius and converting the amorphous silicon into a polycrystalline form. The amount of heat transferred to the Base substrate is highly limited, e.g., the heat does not dissipate to the Base substrate so that the Base substrate is not damaged at all. By choosing appropriate laser wavelength and power, the method can be applied to melt and crystallize the amorphous silicon layer, without affecting the underlying base substrate.

Optionally, the excimer laser is one of a XeCl laser (e.g., a wavelength of 308 nm), ArF laser, KrF laser and XeF laser, i.e., the excimer laser annealing process is performed by using molecules of XeCl, ArF, KrF, or XeF. Optionally, the excimer laser annealing process is performed at a laser pulse frequency in the range of about 100 Hz to about 400 Hz, e.g., about 100 Hz to about 200 Hz, about 200 Hz to about 300 Hz, or about 300 Hz to about 400 Hz. Optionally, the excimer laser annealing process is performed at an overlapping ratio of about 90% to about 98%, e.g., about 90% to about 93%, about 93% to about 96%, about 96% to about 98%. Optionally, the excimer laser annealing process is performed at a laser pulse width less than 100 ns, e.g., about 15 ns to about 50 ns, about 50 ns to about 75 ns, or about 75 ns to about 95 ns. Optionally, the excimer laser annealing process is performed at a laser energy density of about 100 mJ/cm$^2$ to about 600 mJ/cm$^2$, e.g., about 100 mJ/cm$^2$ to about 300 mJ/cm$^2$, about 300 mJ/cm$^2$ to about 450 mJ/cm$^2$, or about 450 mJ/cm$^2$ to about 600 mJ/cm$^2$.

During the crystallization process (e.g., the excimer laser annealing process), the first dopant in the first dopant layer CD diffuses into the second section of the amorphous silicon layer aSi, and the second dopant in the second dopant layer SDD diffuses into the first section of the amorphous silicon layer aSi. At the same time, the amorphous silicon layer aSi melts and crystallizes into polycrystalline silicon.

Referring to FIG. 1J, the polycrystalline silicon active layer LTPS thus formed includes a second region 2 doped with a dopant of the first dopant layer and a first region 1 doped with a dopant of the second dopant layer. The first region includes a region 1a corresponding to a source electrode and a region 1b corresponding to a drain electrode.

Figure 2K:
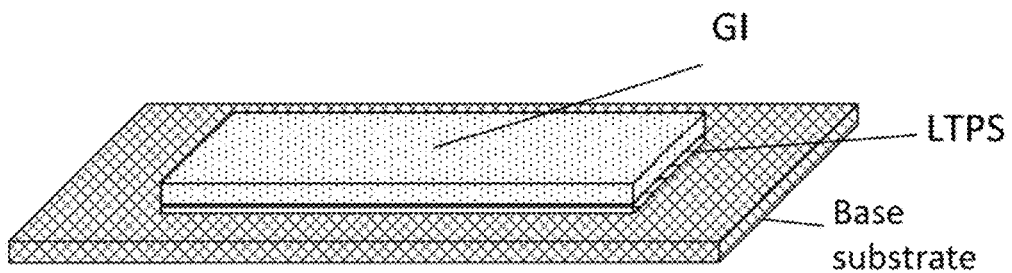

Referring, to FIG. 1K and FIG. 2K, the method in some embodiments further includes forming a gate insulating layer GI on a side of the polycrystalline silicon active layer LTPS distal to the Base substrate. Any appropriate gate insulating materials and any appropriate fabricating methods may be used to make the gate insulating layer GI. For example, a gate insulating material may be deposited on the base substrate by a plasma-enhanced chemical vapor deposition (PECVD) process. Examples of appropriate gate insulating materials include, but are not limited to, silicon oxide (SiO$_y$), silicon nitride (SiN$_y$, e.g., Si$_3$N$_4$), silicon oxynitride (SiO$_x$N$_y$). Optionally, the gate insulating layer GI may have a single-layer structure or a stacked-layer structure including two or more sub-layers (e.g., a stacked-layer structure including a silicon oxide sublayer and a silicon nitride sublayer). Optionally, the gate insulating layer has a thickness in the range of about 80 nm to about 150 nm.

Figure 2L:
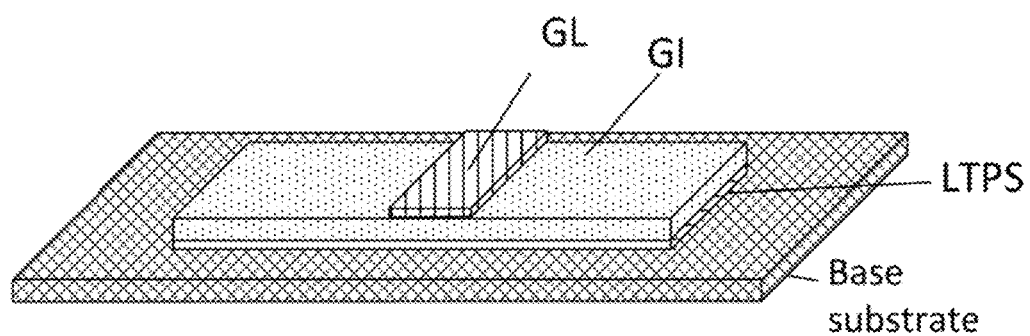

Referring to FIG. 1L and FIG. 2L, the method in some embodiments further includes forming a gate electrode layer GL on a side of the gate insulating layer GI distal to the polycrystalline silicon active layer LTPS. Any appropriate gate electrode materials and any appropriate fabricating methods may be used to make the gate electrode layer GL. For example, a gate electrode material may be deposited on the base substrate (e.g., by sputtering or vapor deposition); and patterned (e.g., by lithography such as a wet etching process) to form the gate electrode layer GL. Examples of appropriate gate electrode materials include, but are not limited to, aluminum, chromium, tungsten, titanium, tantalum, molybdenum, copper, and alloys or laminates containing the same. Optionally, the gate electrode layer may have a single-layer structure or a stacked-layer structure including two or more sub-layers. Optionally, the gate electrode layer has a thickness in the range of about 150 nm to about 300 nm.

Figure 2M:
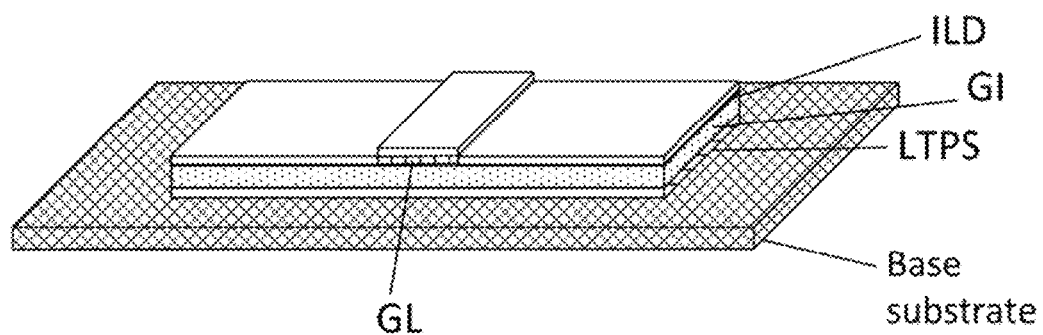

Referring to FIG. 1M and FIG. 2M, the method in some embodiments further includes forming an interlayer dielectric layer ILD on a side of the gate electrode layer GL distal to the gate insulating layer GI. Any appropriate interlayer dielectric materials and any appropriate fabricating methods may be used to make the interlayer dielectric layer ILD. For example, an interlayer dielectric material may be deposited on the base substrate by a plasma-enhanced chemical vapor deposition (PECVD) process. Examples of appropriate interlayer dielectric materials include, but are not limited to, silicon oxide (SiO$_y$), silicon nitride (SiN$_y$, e.g., Si$_3$N$_4$), silicon oxynitride (SiO$_x$N$_y$). Optionally, the interlayer dielectric layer may have a single-layer structure or a stacked-layer structure including two or more sub-layers (e.g., a stacked-layer structure including a silicon oxide sublayer and a silicon nitride sublayer). Optionally, the interlayer dielectric layer ILD has a thickness in the range of about 200 nm to about 500 nm.

Figure 2N:
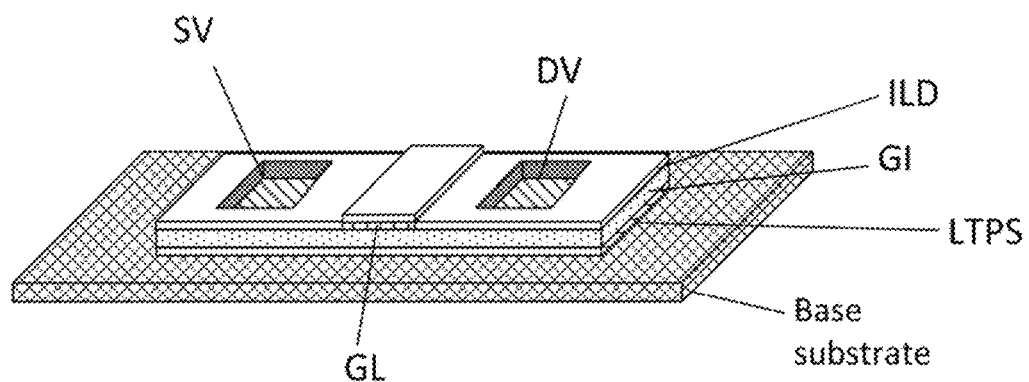
Figure 2O:
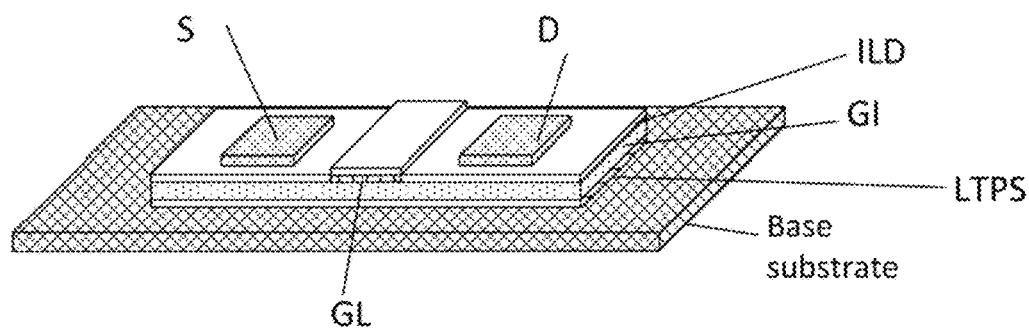

Referring to FIG. 1N and FIG. 2N, the method in some embodiments further includes forming a source via SV and a drain via DV in areas corresponding to the first region of the polycrystalline silicon active layer LTPS (e.g., region 1a and region 1b in FIG. 1J). The source via and the drain via extend through the interlayer dielectric layer ILD and the gate insulating layer GI, exposing the first region 1 of the polycrystalline silicon active layer LTPS (e.g., region 1a and region 1b in FIG. 1J).

Referring to FIG. 1O and FIG. 2O, the method in some embodiments further includes forming a source electrode S and a drain electrode D on a side of the interlayer dielectric layer ILD distal to the polycrystalline silicon active layer LTPS, the source electrode S extending through the source via SV and being in contact with the polycrystalline silicon active layer LTPS, the drain electrode D extending through the drain via DV and being in contact with the polycrystalline silicon active layer LTPS. Any appropriate source electrode and drain electrode materials and any appropriate fabricating methods may be used to make the source electrode S and the drain electrode D. For example, a source electrode and drain electrode material may be deposited on the base substrate (e.g., by sputtering or vapor deposition); and patterned (e.g., by lithography such as a wet etching process) to form the source electrode S and the drain electrode D. Examples of appropriate source electrode and drain electrode materials include, but are not limited to, aluminum, chromium, tungsten, titanium, tantalum, molybdenum, copper, and alloys or laminates containing the same. Optionally, the source electrode and the drain electrode may have a single-layer structure or a stacked-layer structure including two or more sub-layers.

Figure 3:
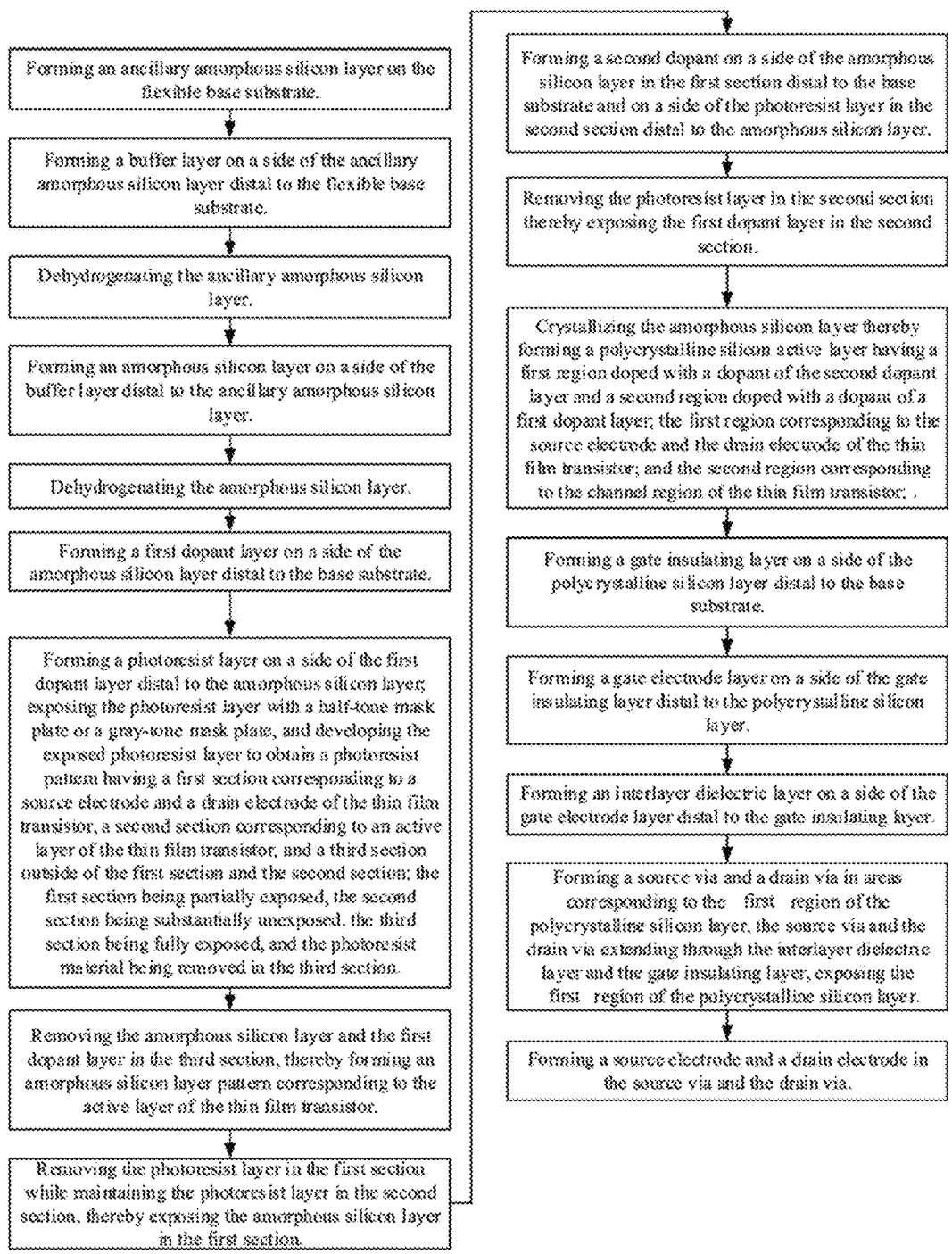
FIG. 3 is a flow chart illustrating a fabricating process of a thin film transistor in some embodiments.

FIG. 3 is a flow chart illustrating a fabricating process of a thin film transistor in some embodiments. Referring to FIG. 3, the method of fabricating the thin film transistor in the embodiment include forming an ancillary amorphous silicon layer on the flexible base substrate; forming a buffer layer on a side of the ancillary amorphous silicon layer distal to the flexible base substrate; dehydrogenating the ancillary amorphous silicon layer; forming an amorphous silicon layer on a side of the buffer layer distal to the ancillary amorphous silicon layer; dehydrogenating the amorphous silicon layer; forming a first dopant layer on a side of the amorphous silicon layer distal to the base substrate; forming a photoresist layer on a side of the first dopant layer distal to the amorphous silicon layer; exposing the photoresist layer with a half-tone mask plate or a gray-tone mask plate, and developing the exposed photoresist layer to obtain a photoresist pattern having a first section corresponding to a source electrode and a drain electrode of the thin film transistor, a second section corresponding to an active layer of the thin film transistor, and a third section outside of the first section and the second section; the first section being partially exposed, the second section being substantially unexposed, the third section being fully exposed; and the photoresist material being removed in the third section; removing the amorphous silicon layer and the first dopant layer in the third section, thereby forming an amorphous silicon layer pattern corresponding to the active layer of the thin film transistor; removing the photoresist layer in the first section while maintaining the photoresist layer in the second section, thereby exposing the amorphous silicon layer in the first section; forming a second dopant layer on a side of the amorphous silicon layer in the first section distal to the base substrate and on a side of the photoresist layer in the second section distal to the amorphous silicon layer; removing the photoresist layer in the second section thereby exposing the first dopant layer in the second section; crystallizing the amorphous silicon layer thereby forming a polycrystalline silicon active layer having a first region doped with a dopant of the second dopant layer and a second region doped with a dopant of the first dopant layer, the first region corresponding to the source electrode and the drain electrode of the thin film transistor; and the second region corresponding to the channel region of the thin film transistor; forming a gate insulating layer on a side of the polycrystalline silicon active layer distal to the base substrate; forming a gate electrode layer on a side of the gate insulating layer distal to the polycrystalline silicon active layer; forming an interlayer dielectric layer on a side of the gate electrode layer distal to the gate insulating layer; forming a source via and a drain via in areas corresponding to the first region of the polycrystalline silicon active layer, the source via and the drain via extending through the interlayer dielectric layer and the gate insulating layer, exposing the first region of the polycrystalline silicon active layer; and forming a source electrode and a drain electrode in the source via and the drain via.

In some embodiments, the method further includes forming one or more layer (e.g., an ohmic contact layer) between the source electrode and the polycrystalline silicon active layer, and between the drain electrode and the polycrystalline silicon active layer. Optionally, the method further includes forming an ohmic contact layer between the source electrode and the polycrystalline silicon active layer. Optionally, the method further includes forming an ohmic contact layer between the drain electrode and the polycrystalline silicon active layer.

In another aspect, the present disclosure provides a thin film transistor. In some embodiments, the thin film transistor includes a polycrystalline silicon active layer on a base substrate, a gate insulating layer on a side of the polycrystalline silicon active layer distal to the base substrate, a gate electrode layer on a side of the gate insulating layer distal to the polycrystalline silicon active layer, and a source electrode and a drain electrode on a side of the gate insulating layer distal to the polycrystalline silicon active layer, the source electrode and the drain electrode extending through the gate insulating layer and in contact with the polycrystalline silicon active layer. The polycrystalline silicon active layer includes a channel region and a source electrode and drain electrode contact region. The polycrystalline silicon active layer is in contact with the source electrode and the drain electrode in the source electrode and drain electrode contact region. The channel region is doped with a first dopant having a first conductivity, and the source electrode and drain electrode contact region is doped with a second dopant having a second conductivity.

In some embodiments, the source electrode and the drain electrode are in direct contact with the source electrode and drain electrode contact region. In some embodiments, the source electrode and the drain electrode are in contact with the source electrode and drain electrode contact region through one or more layers, e.g., an ohmic contact layer. Optionally, the thin film transistor further includes an ohmic contact layer between the source electrode and the polycrystalline silicon active layer. Optionally, the thin film transistor further includes an ohmic contact layer between the drain electrode and the polycrystalline silicon active layer.

In another aspect, the present disclosure provides a thin film transistor fabricating by a method described herein.

In another aspect, the present disclosure provides an array substrate having a thin film transistor described herein or fabricated by a method described herein.

In another aspect, the present disclosure provides a display apparatus having an array substrate described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a polycrystalline silicon thin film transistor, comprising:

forming an amorphous silicon layer on a base substrate having a pattern corresponding to a polycrystalline silicon active layer of the thin film transistor, the amorphous silicon layer having a first region corresponding to a source electrode and drain electrode contact region in the polycrystalline silicon active layer and a second region corresponding to a channel region in the polycrystalline silicon active layer;

forming a first dopant layer on a side of the second region distal to the base substrate;

forming a second dopant layer on a side of the first region distal to the base substrate; and crystallizing the amorphous silicon layer, the first dopant layer, and the second dopant layer to form the polycrystalline silicon active layer, the polycrystalline silicon active layer being doped with a dopant of the first dopant layer in the second region and doped with a dopant of the second dopant layer in the first region during the step of crystallizing the amorphous silicon layer;

wherein the amorphous silicon layer and the first dopant layer are formed using a single mask plate;

wherein the step of forming the amorphous silicon layer and the first dopant layer using a single mask plate comprises:

depositing an amorphous silicon material layer on the base substrate; forming a first dopant material layer on a side of the amorphous silicon material layer distal to the base substrate; forming a photoresist layer on a side of the first dopant material layer distal to the amorphous silicon material layer; exposing the photoresist layer with a half-tone mask plate or a gray-tone mask plate, and developing the exposed photoresist layer to obtain a photoresist pattern having a first section corresponding to the first region, a second section corresponding to the second region, and a third section outside of the first section and the second section, the first section being partially exposed, the second section being substantially unexposed, the third section being fully exposed, and the photoresist material being removed in the third section; removing the amorphous silicon material layer and the first dopant layer in the third section, thereby forming the amorphous silicon layer having the pattern corresponding to the active layer of the thin film transistor; and removing the photoresist layer in the first section while maintaining the photoresist layer in the second section, thereby exposing the amorphous silicon layer in the first section.

2. The method of claim 1, wherein the crystallizing step is performed using excimer laser annealing.

3. The method of claim 2, wherein the excimer laser annealing is performed with an overlapping ratio of about 90% to about 98%.

4. The method of claim 1, wherein the first dopant layer is formed to be in direct contact with the second region.

5. The method of claim 1, wherein the second dopant layer is formed to be in direct contact with the first region.

6. The method of claim 1, wherein the first dopant layer is formed on a side of both the first region and the second region distal to the base substrate; and the polycrystalline silicon active layer in the first region is doped with both the dopant of the first dopant layer and the dopant of the second dopant layer.

7. The method of claim 1, further comprising:

forming a second dopant material layer, on a side of the amorphous silicon layer in the first section distal to the base substrate and on a side of the photoresist layer in the second section distal to the amorphous silicon layer; and removing the photoresist layer in the second section thereby exposing the first dopant layer in the second section.

8. The method of claim 7, wherein the photoresist layer in the second section is removed by a lift-off method using a lift-off solvent.

9. The method of claim 1, further comprising dehydrogenating the amorphous silicon layer prior to the step of crystallizing the amorphous silicon layer, the first dopant layer, and the second dopant layer.

10. The method of claim 1, further comprising forming a buffer layer on the base substrate prior to the step of forming the amorphous silicon layer, the amorphous silicon layer being formed on a side of the buffer layer distal to the base substrate.

11. The method of claim 10, further comprising forming an ancillary amorphous silicon layer on the base substrate prior to the step of forming the buffer layer, the buffer layer being formed on a side of the ancillary amorphous silicon layer distal to the base substrate.

12. The method of claim 11, further comprising dehydrogenating the ancillary amorphous silicon layer prior to the step of crystallizing the amorphous silicon layer, the first dopant layer, and the second dopant layer.

13. The method of claim 1, further comprising forming a gate insulating layer on a side of the polycrystalline silicon active layer distal to the base substrate; forming a gate electrode layer on a side of the gate insulating layer distal to the polycrystalline silicon active layer; forming a source via and a drain via in areas corresponding to the first region, the source via and the drain via extending through the gate insulating layer, exposing the first region of the polycrystalline silicon active layer; and forming a source electrode and a drain electrode on a side of the gate insulating layer distal to the base substrate, the source electrode extending through the source via and in contact with the polycrystalline silicon active layer, the drain electrode extending through the drain via and in contact with the polycrystalline silicon active layer.

14. The method of claim 1, wherein the amorphous silicon layer has a thickness in the range of about 30 nm to about 60 nm.

15. The method of claim 1, wherein the first dopant layer has a concentration of the first dopant in a range of about $1 \times 10^{11}$ atom/cm$^3$ to $1 \times 10^{13}$ atom/cm$^3$.

16. The method of claim 1, wherein the second dopant layer has a concentration of the second dopant in a range of about $1 \times 10^{14}$ atom/cm$^3$ to $1 \times 10^{16}$ atom/cm$^3$.

17. A polycrystalline silicon thin film transistor fabricating by a method of claim 1.

18. A display apparatus comprising a polycrystalline silicon thin film transistor of claim 17.

* * * * *